HIGH POWER SEMICONDUCTOR DEVICE

Filed Nov. 29, 1967

INVENTORS.
Robert M. Burton,
Donald E. Lake &
BY Eugene H. Sayers

R. J. Wallace
ATTORNEY

United States Patent Office 3,512,050

Patented May 12, 1970

3,512,050

HIGH POWER SEMICONDUCTOR DEVICE

Robert M. Burton, Donald E. Lake, and Eugene H. Sayers, Kokomo, Ind., assignors to General Motors Corporation, Detroit, Mich., a corporation of Delaware Filed Nov. 29, 1967, Ser. No. 686,465
Int. Cl. H01l 1/12, 1/14
U.S. Cl. 317—234 4 Claims

ABSTRACT OF THE DISCLOSURE

A high power semiconductor signal translating device having an improved capsule construction for reducing semiconductor element fatigue introduced by fabrication and thermal cycling. The thick base member of a high power device capsule has a significantly thinner section in the region bonded to the semiconductor element. In a preferred embodiment for a high power stud mounted capsule, the stud is hollow.

BACKGROUND OF THE INVENTION

This invention primarily concerns high power semiconductor devices, that is devices capable of handling in excess of 25 amperes. However, it is also useful in lesser power devices. In passing power greater than about 1 ampere through a semiconductor device special provisions should be provided to quickly remove heat generated within the semiconductor wafer of that device. If not, the wafer can achieve an overall temperature which would degenerate its predetermined electrical characteristics. Of course, the higher the power the wafer handles, the greater the cooling requirement for that wafer.

It has been the practice to mount semiconductor elements capable of handling more than 2 or 3 amperes directly on a large mass of copper, which forms the base member of an enclosing capsule. In the EIA standard TO–36 and TO–3 package designs, for example, this base member is approximately ⅛ inch in thickness. In this package wafer elements in excess of ¼ inch in maximum linear dimension on a major surface are frequently used to handle currents of 5 to 15 amperes. In semiconductor rectifiers capable of handling loads in excess of 100 amperes in the forward direction and 1000 volts in the reverse direction, the wafers are more than ½ inch wide and are mounted on base members more than about ¼ inch in minimum thickness. These base members are in turn directly mounted on an appropriate thermal transfer means, most frequently on air or water cooled heat sinks.

It is well appreciated that for best performance the base member itself of power device capsules should be of sufficient mass to function as a heat sink. However, this large mass also has a detrimental effect. It produces undesirable stresses in the semiconductor wafer due to the difference in thermal expansion characteristics of the metal of the base member and the wafer soldered to it.

Accordingly, to reduce the stresses applied to the wafer in power devices it has been the practice to interpose a material of intermediate expansion characteristics between the semiconductor wafer and the base member. Disks of tungsten or molybdenum have been used. However, using this intermediate compensating element increases thermal and electrical resistance between the base member and the wafer. Hence, these disadvantages must be weighed against the advantage in stress relief which is obtained.

Electrical and thermal resistance of the intermediate element varies directly with its thickness. On the other hand, the thicker the base member and the wafer, the thicker the intermediate member must be for adequate stress relief. Hence, with unusually thick base members the compensating element must be of appreciable thickness. For example, in devices capable of handling 200 or more amperes, the compensating element is more than about ⅛ inch. This appreciably increases thermal and electrical resistance of the compensating element, as well as cost. On the other hand, reducing the thickness of the base member reduces its cooling effectiveness. Consequently, in the past one had to compromise between base member thickness and intermediate element thickness in order to obtain the desired resultant device characteristics. This compromise necessarily resulted in a device of lower power handling characteristics than might otherwise be possible.

SUMMARY OF THE INVENTION

It is, therefore, an object of the invention to provide an improved high power semiconductor device having a novel base member construction for reducing stress in a wafer attached to that base member.

The object of this invention is accomplished by providing a recess in the base member extending over a substantial portion of the area bonded to the semiconductive signal translating cell so as to reduce the effective thickness of the base member in the bonding area of the base member. This invention is particularly applicable to stud mounted semiconductor devices which have a stud portion integral with the base member of the capsule enclosing the semiconductor signal translating cell. In a preferred form the stud portion of the base member is hollow.

We have discovered that the heat flow pattern through the base member substantially occurs in a direction away from the center of the region to which the semiconductive element is attached. We have found that if the thickness of the base member is reduced over a substantial portion of the area bonded to the semiconductive element, stress applied to the semiconductor element is reduced without sacrificing cooling properties of the base. In essence, we significantly reduce the effective thickness of the base member without diminishing its heat transfer characteristics. Hence, we can use a thinner thermal compensating element to obtain an overall improvement in device performance at even somewhat lower cost. In fact, in some applications, it may be possible to omit the intermediate expansion compensating element altogether.

BRIEF DESCRIPTION OF THE DRAWING

Other objects, features and advantages of this invention will become more apparent from the following description of preferred examples thereof and from the drawing, in which.

DESCRIPTION OF THE PREFERRED EMBODIMENTS

Figure 1:
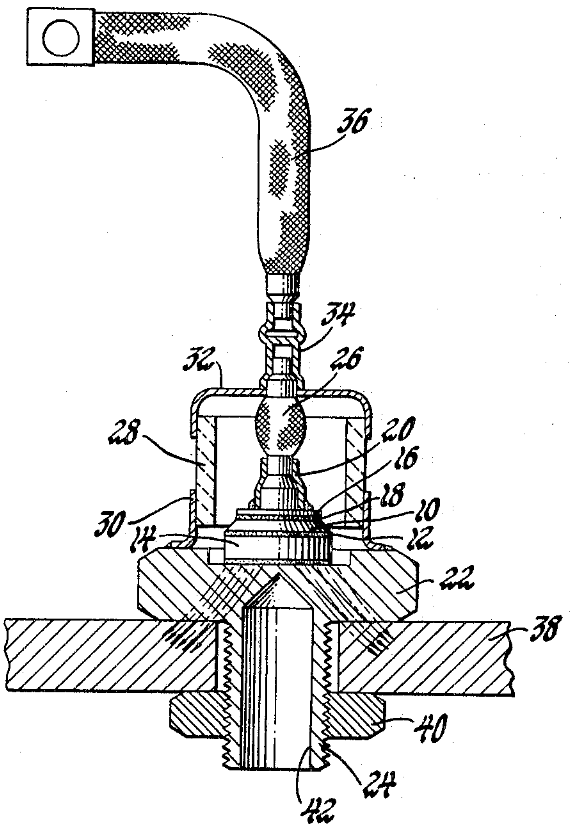
FIG. 1 shows a sectional view of a semiconductor device made in accordance with the invention in which the semiconductor device is mounted on a heat sink.

In FIG. 1 there is shown a high power rectifier such as might be capable of conducting 200 amperes in the forward direction and withstanding a reverse voltage in excess of 1000 volts. This device is generally the same as those which are presently commercially available, except for the novel base member construction which is shown. It includes a silicon wafer 10 having a PN junction separating its upper and lower surfaces. The lower surface is hard soldered at 12 to a tungsten disk 14. A thinner tungsten disk 16 is hard soldered at 18 to the upper surface of the silicon wafer 10. The two disks serve as electrodes for the wafer and with it comprise a signal translating cell. The cell is, in turn, soldered to a capsule base member 22 of copper, aluminum or alloys thereof having a hollow stud portion 24. A copper sleeve 20 is soldered to the top of the tungsten electrode 16. One end of a braided copper wire cable 26, banded on each end, is crimped within the upper portion of the copper sleeve 20. This cable 26 serves as an interior terminal lead for the device.

An end seal, or header assembly forms a hermetic enclosure for the semiconductor cell in combination with base member 22. The end seal includes a ceramic cylinder 28, an outwardly flanged lower copper cylinder 30 and an inwardly flanged upper cylinder 32 of Kovar or low expansion alloy. The band on the upper end of the braided copper wire 26 is crimped to element 34 in the top of the end seal. The flange on the lower cylinder 30 is soldered, brazed or cold welded to the base member to hermetically enclose the cell. An external terminal lead 36 is crimped to the exposed end of tube 34.

Stud portion 24 of the base member is secured to a thermal transfer element 38 by means of a nut 40. Thermal transfer element 38 can be an air or water cooled heat sink. As can be seen from the dotted lines shown in FIG. 1, heat flows outwardly from the cell-base member interface to the heat sink in such a manner that the recess 42 of the hollow stud does not significantly interfere with the flow of heat to the heat sink 38. As can also be seen in FIG. 1, the stud recess 42 preferably terminates at its inner end in a conical shape to obtain the thinnest base member thickness possible without disturbing the heat flow pattern through the base member to the heat sink.

Generally, for maximum benefits the base member recess should be centrally located with respect to the cell-base member interface, should be of the same cross-sectional shape as the interface shape, should have a cross-sectional area at its widest point of at least 50% and preferably 75% of the interface area, and provide an effective average base member thickness in the zone between the interface and the recess which is less than half of the average actual thickness of the balance of the base member. In stud mounted devices, the effective average thickness should be considerably less. The zone between the recess and the interface should not include any part of the stud, and preferably should comprise less than 25% of the actual base member thickness between the cell-base member interface and the surface of the base member from which the stud extends.

The benefits of this invention are equally obtainable with semiconductor wafers which have been produced solely by diffusion techniques, solely by alloying techniques, or by combinations of the two. Analogously, the invention may even provide sufficient improvement in lesser power devices, e.g. 5–100 watts, to permit one to omit the intermediate compensating element 14 entirely. However, in the high power devices, e.g. larger than 100 watts, the invention is used as a complement to thermal compensating element 14 rather than as a substitute for it.

Figure 2:
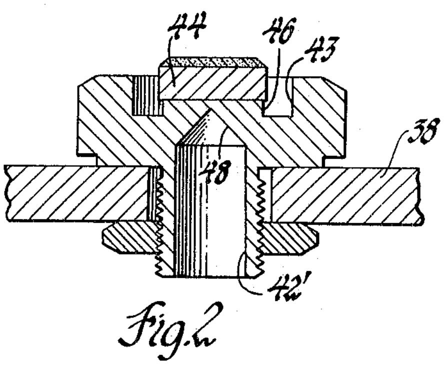
FIGS. 2 through 6 show fragmentary sectional views of alternative embodiments of the base member shown in the capsule construction of FIG. 1.

FIG. 2 shows an alternative embodiment of the subject invention wherein the base member cavity 43 in which the signal translating cell 44 is located contains a pedestal 46 on which the cell is mounted. The conical end portion 48 of recess 42′ extends completely through the major thickness of the base member into the base of the pedestal 46.

Figure 3:
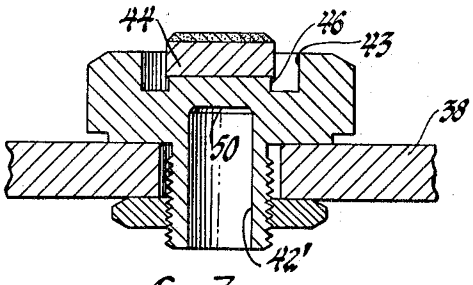

FIG. 3 shows an alternative embodiment of the modification shown in FIG. 2, wherein the recess 42′ has a flat terminal portion 50 rather than the conical terminal portion 48 shown in FIG. 2. It is to be noted, of course, that in this latter embodiment the minimum actual thickness of the base member between the cell and the recess is somewhat larger than the minimum actual thickness of the embodiment shown in FIG. 2, to obtain the same average effective thickness.

Figure 4:
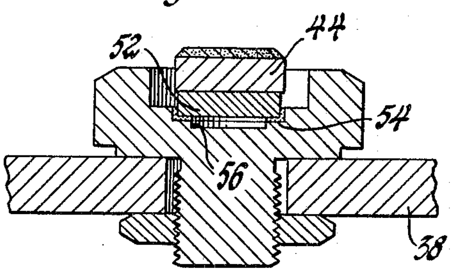

FIG. 4 shows another way in which the effective thickness of the base member can be reduced. The recess in the base member need not necessarily extend from the bottom of the stud. It can be provided by machining away a significant portion of the upper surface of the base member in the cell-base member bonding area. In FIG. 4 the signal translating cell is bonded to an intermediate copper element 52 which is, in turn, soldered at 54 to a shoulder in the base member. Recess 56 is provided below copper element 52. It is understood, of course, that recess 56 could also be provided in a similar fashion in a pedestal, such as shown in connection with FIGS. 2 and 3.

Figure 5:
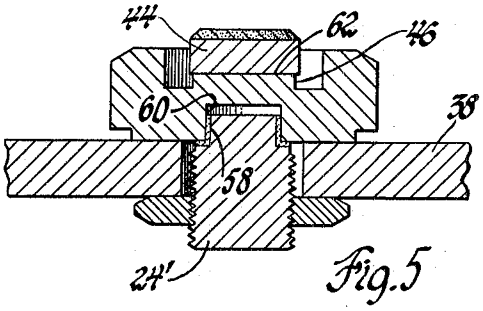

One can provide the recess and its attendant decrease in effective base member thickness in still another way. Moreover, one can also substitute another metal for the stud portion of the base member. FIG. 5 shows a base member having a steel stud portion 24′ brazed at 58 to a recess 60 in the lower surface of the base member. While stud 24′ is solid, its upper surface does not touch and is not brazed to the end of recess 60. Consequently, the effective thickness of the base over a significant portion of the cell-base member mounting area is the distance between the upper surface 62 of the pedestal and the recess 60.

Figure 6:
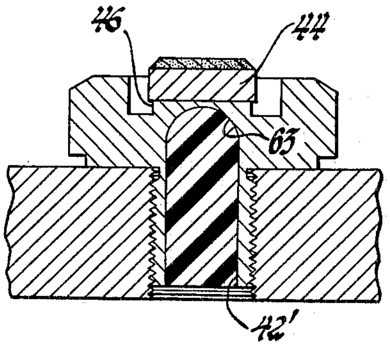

In addition, FIG. 6 shows that the terminal portion 63 of the recess 42′ most closely adjacent the cell-base member bonding area can be hemispherical, and that the stud recess can be filled with other materials which will not affect the thermal expansion characteristics provided in the base member by the recess. For example, the recess can be filled with wax, plastic, etc.

It is to be understood that although this invention has been described in connection with certain specific examples thereof, no limitation is intended thereby except as defined in the appended claims. As, for example, while this invention has been described in connection with a signal translating cell composed of tungsten electrodes hard soldered to a silicon semiconductor, the electrodes can be of other metals, such as molybdenum, the semiconductor element can be of other semiconductors both simple and compound, and the semiconductor cell can be composed of a semiconductor element alone, without any attached electrodes, or with only one electrode.

We claim:

1. A semiconductor signal translating device for handling currents of at least 100 amperes, said device comprising an enclosure for a semiconductive signal translating cell, said enclosure including at least one electrical terminal element and a thick base member having a surface thereon for supporting said cell within said enclosure, a semiconductive signal translating cell bonded to said surface, a stud-like elongation of said base member outside said enclosure opposite said cell for attaching said enclosure to a supporting heat transfer assembly, said base member having a recess therein between said surface and said stud-like elongation for reducing the generation of stresses deleterious to operation of said cell, said recess extending across more than 80% of the cross section of said elongation and 75% of the cell base member bonding area, and said recess producing an effective base member thickness in said area of less than about 25% of the actual base member thickness between the cell-base member interface and the surface of the base member from which said stud-like elongation extends.

2. A signal translating device such as defined in claim 1 wherein the base member is copper and the elongation of said base member is of steel brazed to the copper.

3. A signal translating device such as defined in claim 1 wherein said elongation is a hollow threaded stud integral with said base member and said recess is the hollow portion of said stud.

4. A signal translating device such as defined by claim 3 wherein the semiconductive signal translating cell includes a silicon wafer at least ¼ inch wide having a PN junction separating its opposite major surfaces, and a contact element soldered to at least the base member-contacting surface thereof, with said contact being formed of a material selected from the group consisting of molybdenum, tungsten, mixtures thereof, alloys thereof and laminates of such materials, wherein said base member is of copper, and wherein the recess extending along the length of said stud also extends through at least ¾ the thickness of said base member between the cell-base member interface and the surface from which said stud extends.

References Cited

UNITED STATES PATENTS

| | | | |
|---|---|---|---|
| 2,960,639 | 11/1960 | Tipple | 317—234 |
| 2,994,017 | 7/1961 | Kadelburg | 317—234 |
| 3,013,191 | 12/1961 | Connell | 317—234 |
| 3,265,805 | 8/1966 | Carlan et al. | 174—52 |
| 3,361,195 | 1/1968 | Meyerhoff et al. | 165—80 |
| 3,389,305 | 6/1968 | Bond | 317—100 |
| 3,400,543 | 9/1968 | Ross | 317—234 X |

FOREIGN PATENTS

| | | |
|---|---|---|
| 677,793 | 1/1964 | Canada. |

JOHN W. HUCKERT, Primary Examiner

R. F. POLISSACK, Assistant Examiner

U.S. Cl. X.R.

317—235